(12) United States Patent
Bando et al.

(10) Patent No.: US 6,288,585 B1
(45) Date of Patent: Sep. 11, 2001

(54) SEMICONDUCTOR DEVICE USING EXTERNAL POWER VOLTAGE FOR TIMING SENSITIVE SIGNALS

(75) Inventors: Yoshihide Bando; Nobutaka Taniguchi; Hiroyoshi Tomita; Kota Hara; Naoharu Shinozaki, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/535,745

(22) Filed: Mar. 27, 2000

(30) Foreign Application Priority Data

Jun. 18, 1999 (JP) .................................. 11-171774
Jun. 18, 1999 (JP) .................................. 11-172611

(51) Int. Cl.$^7$ ...................................................... H03L 7/06
(52) U.S. Cl. ........................... 327/156; 327/111; 327/291
(58) Field of Search ..................... 327/108, 109, 327/111, 112, 147, 149, 150, 156, 158, 159, 291, 293, 294, 295, 296, 297, 298, 299

(56) References Cited

U.S. PATENT DOCUMENTS 6,169,435 * 1/2001 Fujii et al. ........................... 327/261

FOREIGN PATENT DOCUMENTS 2-146761   6/1990 (JP).
10-247389  9/1998 (JP).

* cited by examiner

Primary Examiner—Jeffrey Zweizig
(74) Attorney, Agent, or Firm—Arent Fox Kintner Plotkin & Kahn, PLLC

(57) ABSTRACT

A semiconductor device receiving a stable external power voltage includes a reduced-voltage-generation circuit which generates an internally reduced power voltage, an input circuit which operates based on the internally reduced power voltage, causing the internally reduced power voltage to fluctuate, a clock-control circuit which generates an internal clock signal, an output circuit which outputs a data signal to an exterior of the device at output timings responsive to the internal clock signal, a clock-delivery circuit which conveys the internal clock signal from the clock-control circuit to the output circuit, and operates based on the external power voltage such as to make the output timings substantially unaffected by fluctuation of the internally reduced power voltage.

10 Claims, 10 Drawing Sheets

SEMICONDUCTOR DEVICE USING EXTERNAL POWER VOLTAGE FOR TIMING SENSITIVE SIGNALS

BACKGROUND OF THE INVENTION

1. Field of the Invention

The present invention relates to semiconductor devices, and particularly relates to a semiconductor device which adjusts a data-signal output timing based on a clock signal.

2. Description of the Related Art

Synchronous semiconductor devices such as an SDRAM (synchronous dynamic random access memory) operate in synchronism with a reference clock signal that is supplied thereto from an exterior of the device, or operate while keeping a predetermined phase relation with the reference clock signal. To achieve such synchronization, semiconductor devices have a control-clock-signal generation circuit provided therein for the purpose of adjusting internal operation timings.

One example of such a control-clock-signal generation circuit is a DLL (delay locked loop) circuit, which adjusts a propagation delay of a reference clock signal inside the device. The DLL circuit typically includes a variable-delay unit for delaying a reference clock signal to output a control clock signal having a predetermined timing, and includes a delay-adjustment unit for adjusting the delay of the reference clock signal based on the phase comparison between the reference clock signal and the delayed reference clock signal.

The control clock signal that is output from the DLL circuit is supplied to an output circuit via a clock buffer where the output circuit outputs a data signal, so that the control clock signal controls the operation timing of the output circuit. Such a DLL circuit has a configuration such as that disclosed in Japanese Patent Laid-open Application No. 10-112182.

In general, a DLL circuit uses a dedicated power voltage in order to prevent its operation from being affected by power noise. A clock buffer provided between the DLL circuit and an output circuit, however, utilizes an internally reduced power voltage that is also used by other circuits provided nearby.

Unfortunately, the internally reduced power voltage may suffer voltage fluctuation. When this happens, a control clock signal, which is supplied from the DLL circuit to the output circuit via the clock buffer, may have jitters because the clock buffer uses the internally reduced power voltage. Jitters end up being fed back to the DLL circuit, thereby reducing phase adjustment accuracy of the DLL circuit.

To avoid this, the clock buffer may be designed to use the same dedicated power voltage that is used by the DLL circuit. A layout restriction of the semiconductor device makes this option difficult. Further, such a design ends up creating noise in the dedicated power voltage provided for the DLL circuit. Noise in the power voltage for dedicated use by the DLL circuit results in a lower accuracy of phase adjustment in the DLL circuit.

Decreases in adjustment accuracy of the DLL circuit are generally main factors that degrade performance of the semiconductor devices.

Accordingly, there is a need for a semiconductor device which can reduce influence of power noises do as to adjust a signal-output timing based on an accurate control clock signal.

SUMMARY OF THE INVENTION

It is a general object of the present invention to provide a semiconductor device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a semiconductor device particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a semiconductor device receiving a stable external power voltage including a reduced-voltage-generation circuit which generates an internally reduced power voltage, a miscellaneous circuit which operates based on the internally reduced power voltage, causing the internally reduced power voltage to fluctuate, a clock-control circuit which generates an internal clock signal, an output circuit which outputs a data signal to an exterior of the device at output timings responsive to the internal clock signal, a clock-delivery circuit which conveys the internal clock signal from the clock-control circuit to the output circuit, and operates based on the external power voltage such as to make the output timings substantially unaffected by fluctuation of the internally reduced power voltage.

In the semiconductor device described above, the clock-delivery circuit operates based on the external power voltage, so that the clockdelivery circuit can provide an accurate internal clock signal to the output circuit, and the output circuit can output the data signal at proper and accurate output timings that are not affected by power noises.

According to another aspect of the present invention, a semiconductor device includes a reduced-voltage-generation circuit which generates an internally reduced power voltage by reducing an external power voltage supplied from an exterior of the device, a miscellaneous circuit which operates based on the internally reduced power voltage, causing the internally reduced power voltage to fluctuate, a clock-control circuit which generates an internal clock signal, an output circuit which outputs a data signal to the exterior of the device at output timings responsive to the internal clock signal, a clock buffer circuit which buffers a clock signal supplied from the exterior of the device to supply the clock signal to the clock-control circuit, and operates solely based on the external power voltage; and buffer circuits which buffer signals supplied from the exterior of the device, and operate based on the internally reduced power voltage.

In the semiconductor device described above, the reduced-voltage-generation circuit is provided for the purpose of reducing power consumption. In this configuration, however, the clock buffer circuit that buffers the clock signal to be supplied to the clock-control circuit uses the external power voltage as its power voltage. The clock buffer circuit is thus unaffected by the fluctuation of the internally reduced power voltage, and can supply a stable and accurate clock signal to the clock-control circuit. This insures that the output circuit outputs the data signal at accurate output timings.

According to another aspect of the present invention, a semiconductor device includes a reduced-voltagegeneration circuit which generates an internally reduced power voltage by reducing an external power voltage supplied from an exterior of the device, a miscellaneous circuit which operates based on the internally reduced power voltage, causing the internally reduced power voltage to fluctuate, first buffer circuits which buffer first signals supplied from the exterior of the device, and operate solely based on the external power voltage, and second buffer circuits which buffer second signals supplied from the exterior of the device, and operate based on the internally reduced power voltage, wherein the first signals are required to be more accurate in timing than are the second signals.

In the semiconductor device described above, the reduced-voltage-generation circuit is provided for the purpose of reducing power consumption. In this configuration, however, the first buffer circuits for buffering the first signals that are required to meet relatively rigorous timing standards use the external power voltage as its power voltage. The first buffer circuits are thus unaffected by the fluctuation of the internally reduced power voltage, and can supply the first signals that maintain accurate timings.

DESCRIPTION OF THE PREFERRED EMBODIMENTS

In the following, embodiments of the present invention will be described with reference to the accompanying drawings. Throughout the following description of the embodiments, a semiconductor device having a DLL circuit will be used as an example of an implementation of the present invention. The present invention, however, is not limited to such a particular configuration.

Figure 1:
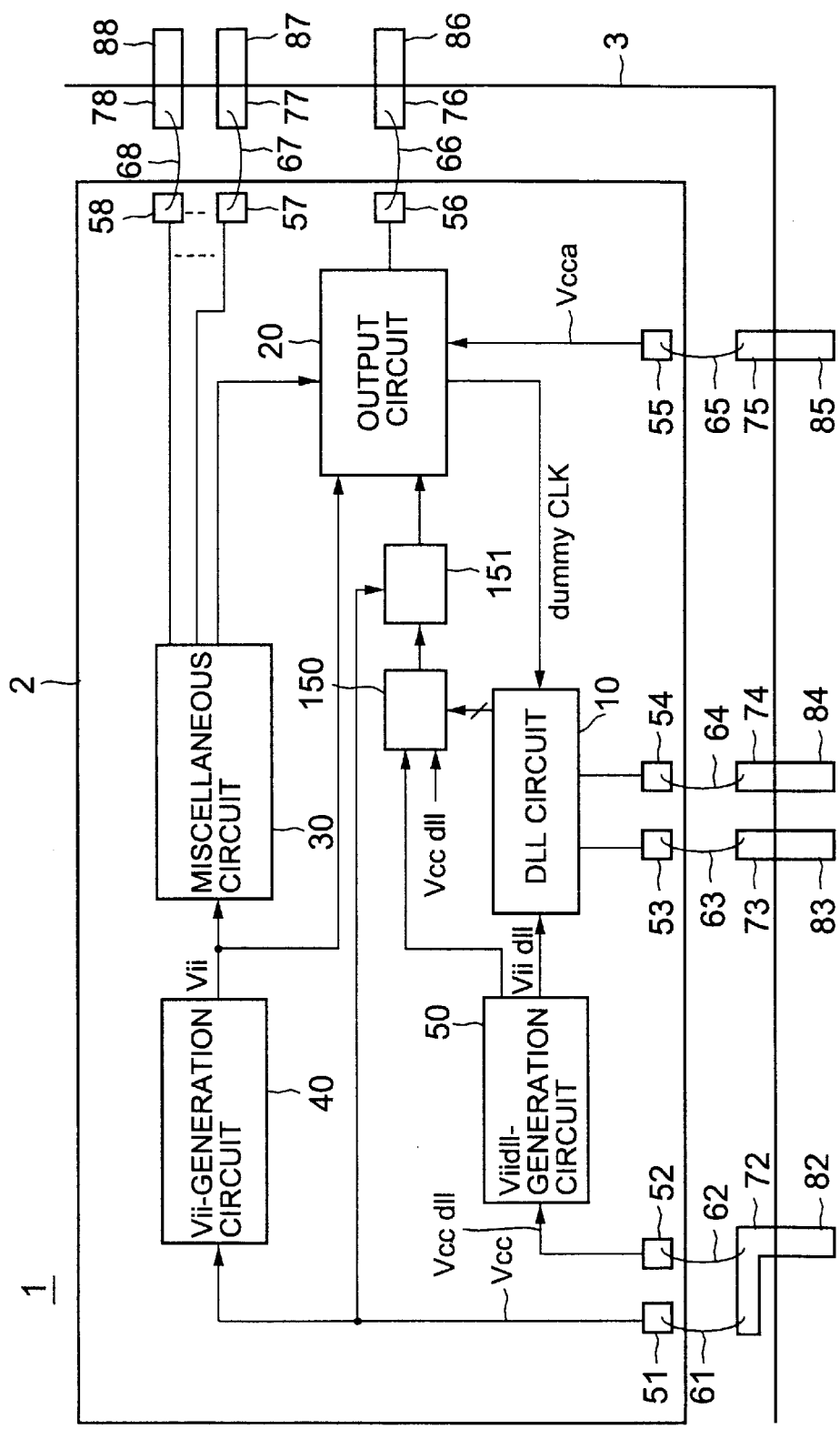
FIG. 1 is a block diagram of a semiconductor device according to an embodiment of the present invention.

FIG. 1 is a block diagram of a semiconductor device according to an embodiment of the present invention.

Figure 11:
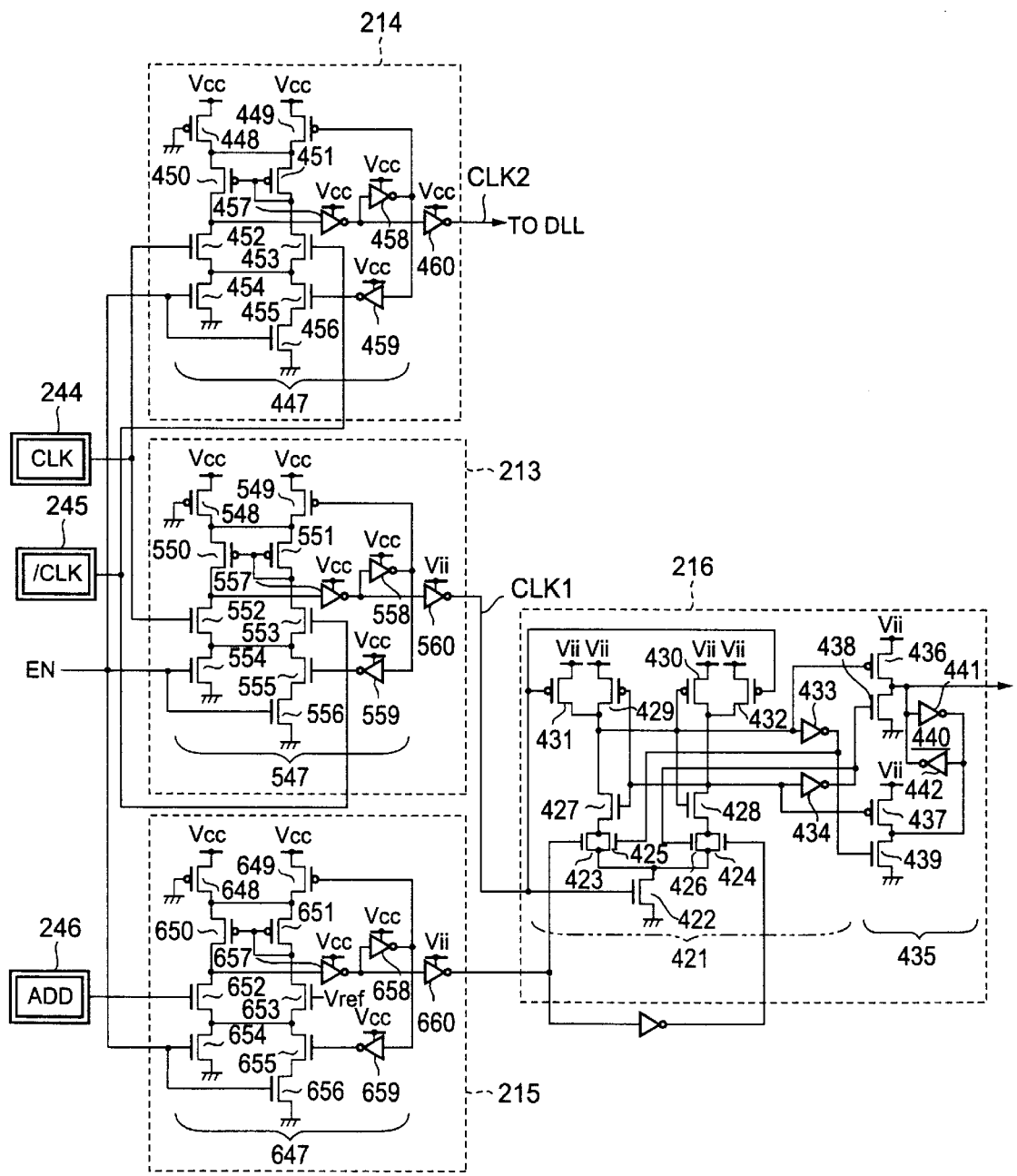
FIG. 11 is a circuit diagram showing part of an address/command-input-circuit portion.

A semiconductor device 1 of FIG. 1 includes a semiconductor chip 2 and a package 3 that houses the semiconductor chip 2 therein. In the package 3, external terminals 82 through 88 are connected to chip pads 51 through 58 via package leads 72 through 78 and bonding wires 61 through 68 as shown in FIG. 11

The semiconductor chip 2 includes a DLL circuit 10, an output circuit 20, a miscellaneous circuit 30, a Vii-generation circuit 40, a Viidll-generation circuit 50, a level converter 150, and a clock buffer 151. The DLL circuit 10 receives a clock signal CLK from the chip pad 53, a clock signal /CLK from the chip pad 54, and a dummy clock signal from the output circuit 20.

The output circuit 20 receives an adjusted control clock signal from the DLL circuit 10 via the level converter 150 and the clock buffer 151, and, also, receives a data signal from the miscellaneous circuit 30. The output circuit 20 outputs the data signal to the chip pad 56 in response to the control clock signal. The miscellaneous circuit 30 includes circuitry for performing expected functions of the semiconductor device 1. The miscellaneous circuit 30 receives relevant signals from the chip pads 57 and 58.

Power voltages are distributed to each circuit as follows. An external power voltage Vcc supplied to the chip pad 51 is supplied to the Vii-generation circuit 40 and to the clock buffer 151. An external power voltage Vccdll supplied to the chip pad 52 is supplied to the Viidll-generation circuit 50 and to the level converter 150.

The Vii-generation circuit 40 generates an internally reduced power voltage Vii from the external power voltage Vcc, and supplies the internally reduced power voltage Vii to the output circuit 20 and the miscellaneous circuit 30. From the external power voltage Vccdll, the Viidll-generation circuit 50 generates a dedicated power voltage Viidll for use by the DLL circuit 10, and supplies the dedicated power voltage Viidll to the DLL circuit 10 and the level converter 150.

Further, an external power voltage Vcca supplied to the chip pad 55 is supplied to the output circuit 20. In this configuration, the output circuit 20 receives the external voltage Vcca and the internally reduced power voltage Vii. The clock buffer 151 receives the external power voltage Vcc. The level converter 150 receives the two dedicated power voltages Viidll and Vccdll.

The external voltage Vcc has a high driving power, and is provided with a large capacitance connected thereto at the exterior of the semiconductor chip. Because of this, the external voltage Vcc does not exhibit large voltage fluctuation. Use of the external voltage Vcc instead of use of the internally reduced power voltage Vii for the level converter 150 and the clock buffer 151 makes it possible to suppress influence of power voltage noise, thereby improving adjustment accuracy of the DLL circuit 10.

Figure 2:
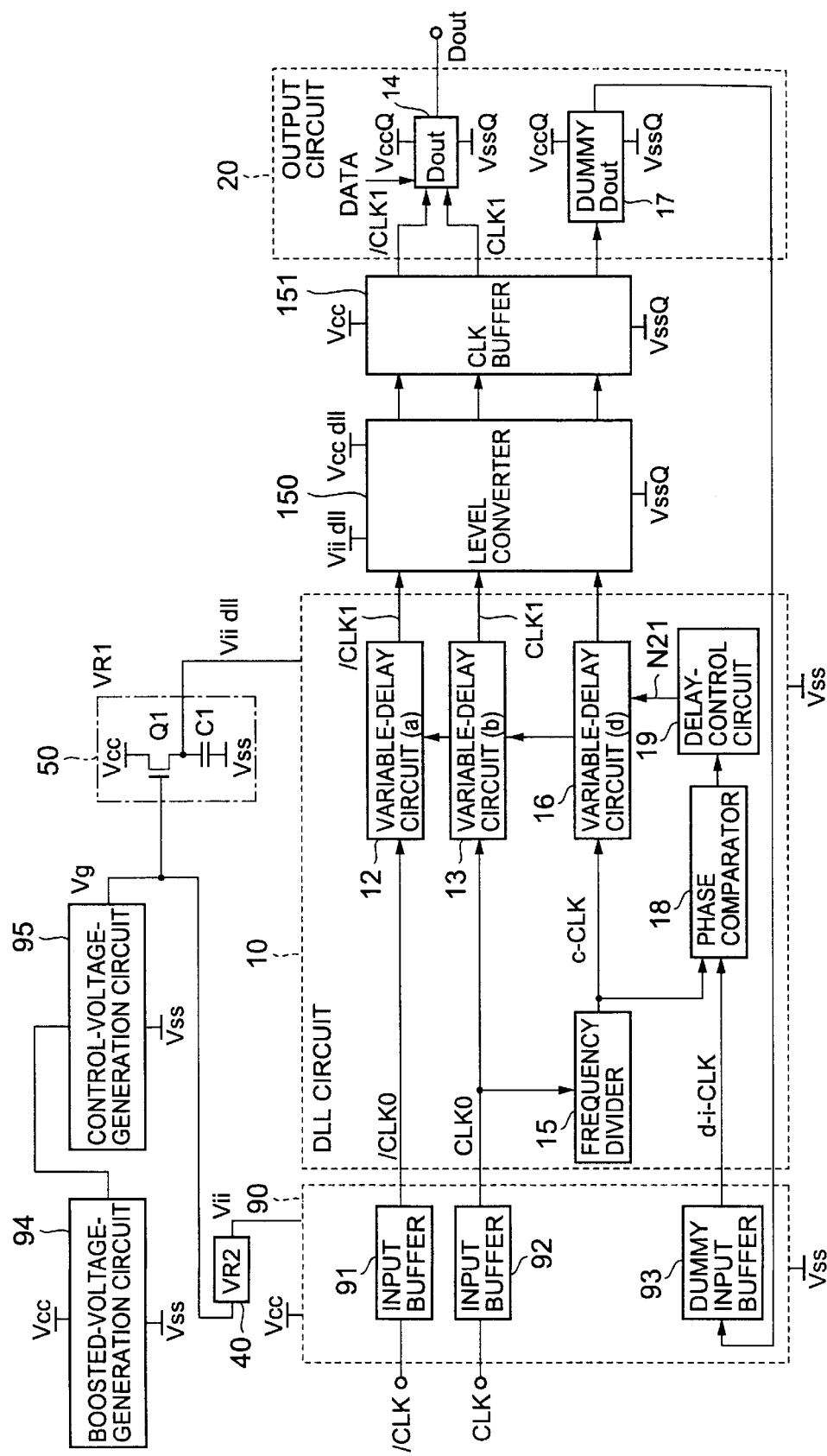
FIG. 2 is a block diagram of a relevant portion of the semiconductor device shown in FIG. 1.

FIG. 2 is a block diagram of a relevant portion of the semiconductor device shown in FIG. 1. A detailed description of the semiconductor device will be given below with reference to FIG. 2.

FIG. 2 shows the DLL circuit 10, the output circuit 20, the level converter 150, the clock buffer 151, and buffer circuits 90. The DLL circuit 10 receives the dedicated power voltage Viidll that is generated from the external voltage Vccdll (which is the same as Vcc as shown in FIG. 1).

In detail, the dedicated power voltage Viidll is generated by a boosted-voltage-generation circuit 94, a control-voltage-generation circuit 95, and the Viidll-generation circuit 50. The boosted-voltage-generation circuit 94 generates a boosted power voltage Vpp by boosting the external power voltage Vcc. The control-voltage-generation circuit 95 generates a gate voltage Vg, which is the boosted power voltage Vpp having a level thereof being controlled. The Viidll-generation circuit 50 generates the dedicated power voltage Viidll from the gate voltage Vg.

The buffer circuits 90 receive the internally reduced power voltage Vii that is generated from the external power voltage Vcc. The internally reduced power voltage Vii is generated by the boosted-voltage-generation circuit 94, the control-voltage-generation circuit 95, and the Vii-generation circuit 40. Here, the Vii-generation circuit 40 generates the internally reduced power voltage Vii from the gate voltage Vg. The output circuit 20 receives either the external power voltage Vcc or an external power voltage Vccq where the external power voltage Vccq is provided for the purpose of driving an output buffer, and may or may not be different from the external power voltage Vcc. The level converter 150 receives the dedicated power voltage Viidll and the dedicated power voltage Vccdll. The clock buffer 151 receives the external power voltage Vcc.

The buffer circuits 90 include input buffers 90 and 91 and a dummy input buffer 93. The DLL circuit 10 includes variable-delay circuits 12, 13, and 16, a frequency divider 15, a phase comparator 18, and a delay control circuit 19. The output circuit 20 includes a data-output unit 14 and a dummy-output unit 17.

The input buffer 91 receives the clock signal /CLK, which is an inverse of the clock signal CLK. The input buffer 92 receives the clock signal CLK. The dummy-input buffer 93 receives a feedback signal supplied from the output circuit 20, as will be described later in detail.

The input buffer 91 supplies the clock signal /CLK to the variable delay circuit 12 as a clock signal /CLK0. The input buffer 92 supplies the clock signal CLK to the variable delay circuit 13 and the frequency divider 15 as a clock signal CLK0. The frequency divider 15 divides a frequency of the supplied clock signal CLK0 to generate a clock signal c-clk, and supplies the clock signal c-clk to the variable delay circuit 16 and the phase comparator 18.

The variable delay circuits 12 and 13 delay the supplied clock signals /CLK0 and CLK0, respectively, and generate respective control clock signals /CLK1 and CLK1 each having a controlled phase. The control clock signals /CLK1 and CLK1 are supplied to the level converter 150.

The level converter 150 changes signal levels of the control clock signals /CLK1 and CLK1 such that a level based on the dedicated power voltage Viidll is converted to a level based on the dedicated power voltage Vccdll. Here, the power voltage Vccdll is higher than the power voltage Viidll. The level converter 150 supplies the level-converted control clock signals /CLK1 and /CLK1 to the clock buffer 151.

The clock buffer 151 supplies the control clock signals /CLK1 and CLK1 to the data-output unit 14. The data-output unit 14 receives a data signal from the miscellaneous circuit 30, and outputs the data signal as an output data signal Dout at a timing responsive to the control clock signals /CLK1 and CLK1.

The clock signal c-clk generated by the frequency divider 15 is supplied to the feedback loop that includes the variable delay circuit 16, the level converter 150, the clock buffer 151, the dummy-output unit 17, the dummy-input buffer 93, the phase comparator 18, and the delay-control circuit 19. The clock signal supplied to the feedback loop is delayed by the variable delay circuit 16, the level converter 150, the clock buffer 151, the dummy-output unit 17, and the dummy-input buffer 93 to be supplied as a clock signal d-i-clk to the phase comparator 18.

In this manner, the phase comparator 18 receives the clock signal c-clk and the clock signal d-i-clk, and compares phases between these clock signals. The results of phase comparison are supplied to the delay-control circuit 19, which in turn controls delays of the variable delay circuits 12, 13, and 16 so as to have an identical phase between the clock signal c-clk and the clock signal d-i-clk. For the delay control purpose, the delay control circuit 19 supplies a delay-control signal N21 to the variable delay circuits 12, 13, and 16.

In what follows, the level converter 150 and the clock buffer 151 will be described.

Figure 3:
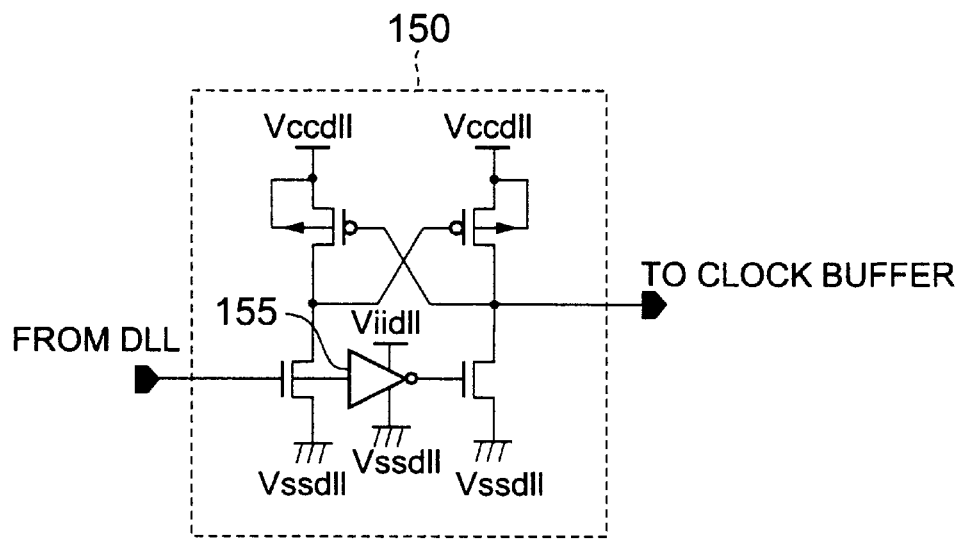
FIG. 3 is a block diagram of an embodiment of a level converter.
Figure 4:
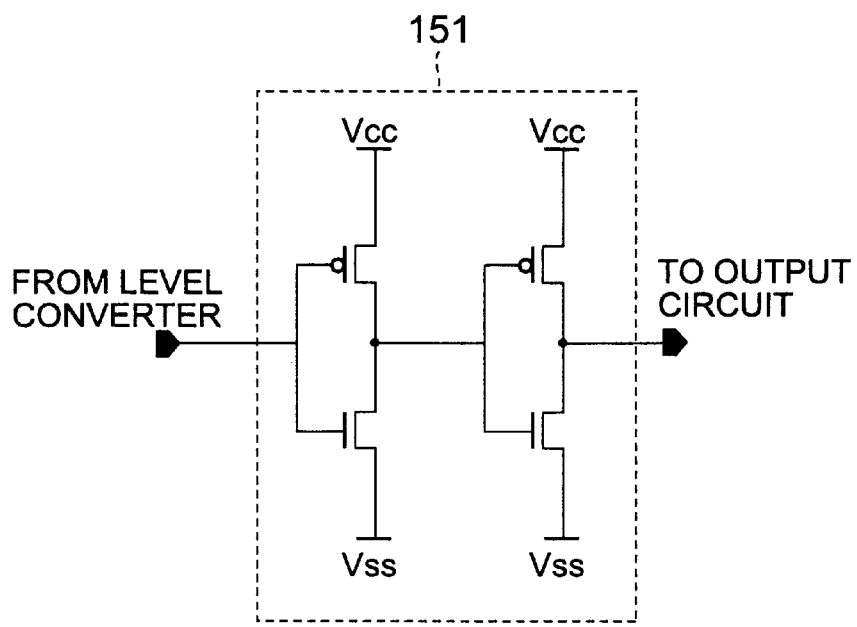
FIG. 4 is a block diagram of an embodiment of a clock buffer.

FIG. 3 is a block diagram of an embodiment of the level converter 150. FIG. 4 is a block diagram of an embodiment of the clock buffer 151.

The level converter 150 of FIG. 3 is necessary in a configuration in which the power voltage used by the clock buffer 151 is the external power voltage Vcc rather than the internally reduced power voltage Vii. It should be noted that the level converter 150 is a normal level converter well known in the art, and uses the dedicated power voltages Viidll and Vccdll.

A control clock signal supplied from the DLL circuit 10 has a signal level that is based on the dedicated power voltage Viidll. Because of this, an inverter 155 of the level converter 150 receives the dedicated power voltage Viidll as a power voltage. Other circuit elements such as NMOS transistors and PMOS transistors receive the dedicated power voltage Vccdll.

Using the dedicated power voltages Viidll and Vccdll, the level converter 150 converts a signal level of the control clock signal supplied form the DLL circuit 10 from a level based on the dedicated power voltage Viidll to a level based on the dedicated power voltage Vccdll.

In this manner, use of the level converter 150 allows the clock buffer 151 to use the external power voltage Vcc that is the same level as Vccdll. This makes voltage fluctuation far less severe compared to when the internally reduced power voltage Vii is used, thereby improving adjustment accuracy of the DLL circuit 10.

In the following, a description will be given with regard to the clock buffer 151 shown in FIG. 4. The clock buffer 151 shown in FIG. 4 includes two stages of CMOS inverter circuits, and the power voltage used by these circuits is different from that used in a conventional configuration. Namely, the clock buffer 151 uses the external voltage Vcc as a power voltage.

The clock buffer 151 alters the control clock signal to a better shape as it is supplied from the level converter 150, and provides the altered control clock signal to the data-output unit 14. Use of the external power voltage Vcc in place of the internally reduced power voltage Vii makes the clock buffer 151 less susceptible to voltage fluctuation, thereby improve the adjustment accuracy of the DLL circuit 10.

In the following, the power voltage used by the DLL circuit 10, the output circuit 20, the level converter 150, and the clock buffer 151 will be described.

Figure 5:
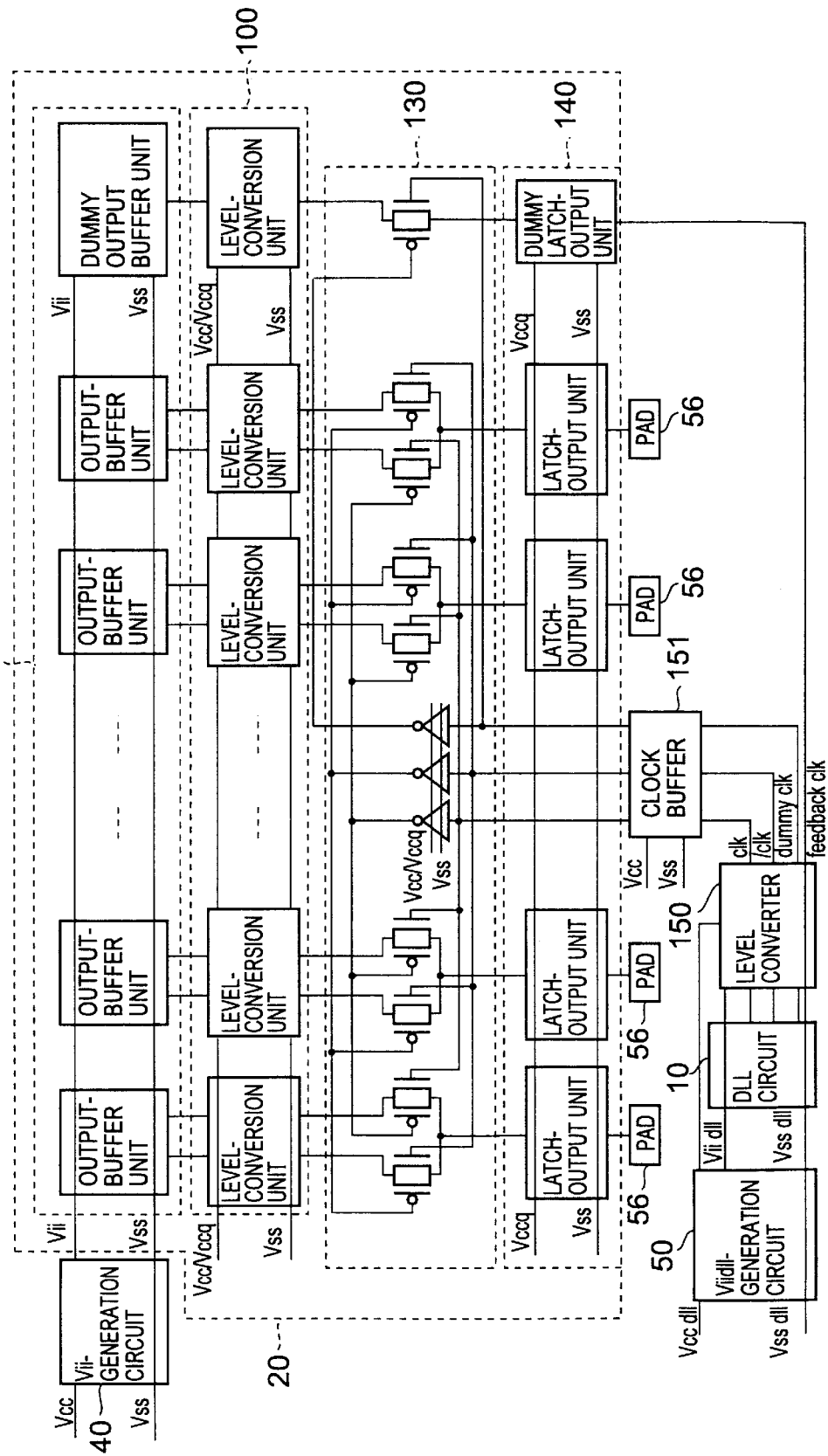
FIG. 5 is a block diagram of a relevant portion of the semiconductor device for explaining use of power voltages according to the present invention.

FIG. 5 is a block diagram of a relevant portion of the semiconductor device for explaining use of power voltages according to the present invention.

The output circuit 20 includes an output-buffer unit 110 or 120, a level-conversion unit 100, a transfer-gate unit 130, and a latch-output unit 140. The output-buffer unit 110 or 120 uses the internally reduced power voltage Vii supplied from the Vii-generation circuit 40. This is because the output-buffer unit 110 or 120 receives data signals that are based on the internally reduced power voltage Vii, so that use of the internally reduced power voltage Vii is necessary for buffering the data signals properly.

The level-conversion unit 100 changes signal levels of the data signals from a level based on the internally reduced power voltage Vii to a level based on the external voltage Vcc or Vccq. As a consequence, all the portion of the output circuit 20 other than the output-buffer unit 110 or 120 uses the external power voltage Vcc or Vccq.

Further, as previously described, the level converter 150 uses the dedicated power voltages Viidll and Vccdll, and the clock buffer 151 uses the external power voltage Vcc.

When the control clock signals supplied from the DLL circuit 10 are considered, these signals are supplied to the transfer-gate unit 130 via the level converter 150 and the clock buffer 151. It is apparent, therefore, that the control clock signals are fed back to the DLL circuit 10 without passing through a circuit that uses the internally reduced power voltage Vii.

In this manner, avoidance of use of the internally reduced power voltage Vii in the level converter 150 and the clock buffer 151 results in the control clock signals being unaffected by noises of the internally reduced power voltage Vii. A reduction of the effect of the internally reduced power voltage Vii on the control clock signals makes it possible to adjust timings of output data signals more accurately based on the control clock signals.

FIG. 5 shows a configuration in which the level converter 150 and the clock buffer 151 are provided outside the output circuit 20. It should be noted, however, that the present invention is not limited to this configuration, and that they may be included in the output circuit 20. A configuration having the level converter 150 and the clock buffer 151 included in the output circuit 20 has an advantage in terms of layout. In what follows, a description will be given with regard to this advantage.

Figure 6:
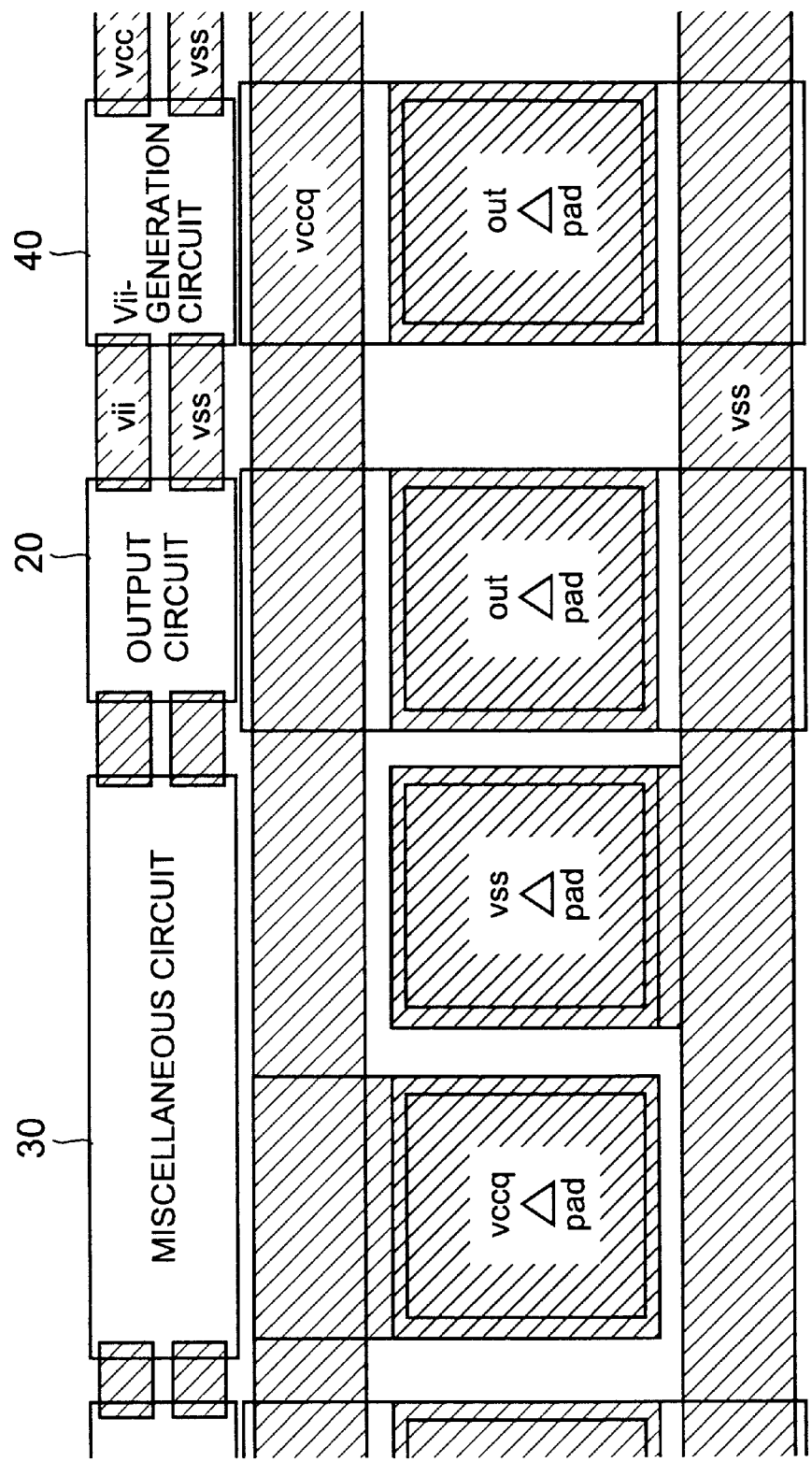
FIG. 6 is an illustrative drawing showing a layout of a related-art semiconductor device with respect to a portion thereof close to an output circuit.
Figure 7:
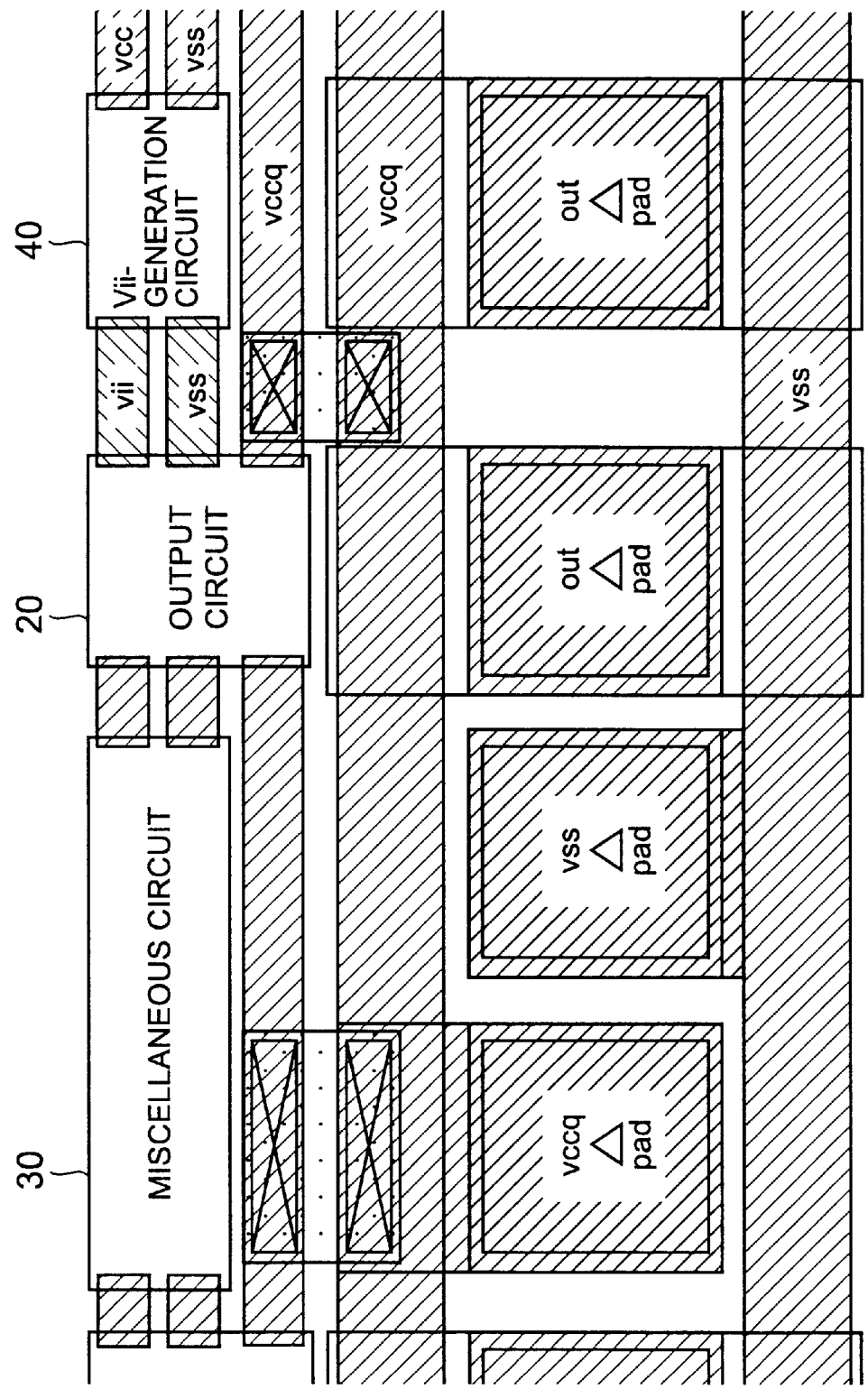
FIG. 7 is an illustrative drawing showing a layout of the semiconductor device of the present invention.

FIG. 6 is an illustrative drawing showing a layout of a related-art semiconductor device with respect to a portion thereof close to the output circuit. FIG. 7 is an illustrative drawing showing a layout of the semiconductor device according to the present invention. In the configurations shown in FIG. 6 and FIG. 7, the level converter 150 and the clock buffer 151 are included in the output circuit 20.

As shown in FIG. 6, the output circuit 20 in the related-art configuration receives the internally reduced power voltages Vii and Vss from the Vii-generation circuit 40. Since the internally reduced power voltages Vii and Vss are also supplied to the miscellaneous circuit 30, these voltages may show fluctuation when the miscellaneous circuit 30 operates.

In the present invention, the output circuit 20 receives the internally reduced power voltage Vii and Vss from the Vii-generation circuit 40, and, also, receives the external power voltage Vcc or Vccq. The external power voltage Vcc or Vccq has a high driving power, and is provided with a large capacitance connected thereto at the exterior of the chip, so that this voltage shows little fluctuation.

The layout as shown in FIG. 7 makes it easy to provide the external power voltage Vccq to the output circuit 20, thereby reducing an effect of power-voltage noise.

In what follows, the data-output unit 14 of the output circuit 20 will be described.

Figure 8:
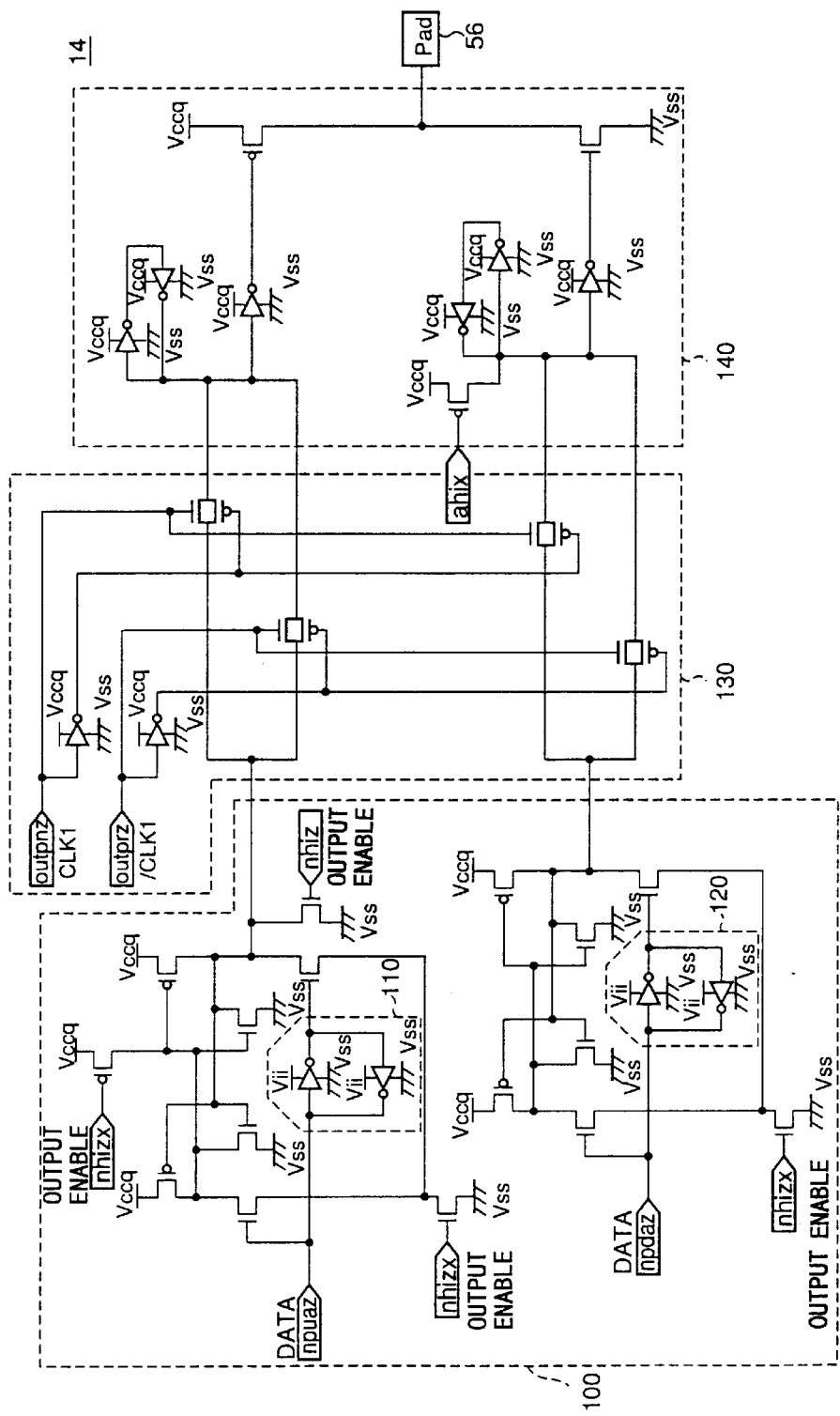
FIG. 8 is a circuit diagram of a data-output unit.

FIG. 8 is a circuit diagram of the data-output unit 14.

The data-output unit 14 of FIG. 8 uses the external power voltage Vcc or the external power voltage Vccq where Vccq is separate from the external power voltage Vcc and used for output buffers. As shown in FIG. 8, the external power voltage Vccq (or Vcc in place of Vccq) is used throughout the circuitry for the purpose of avoiding power-voltage noises except for a few exceptions of use of Vii in the circuitry where it is necessary. Since the external power voltage Vcc or Vccq shows little voltage fluctuation, use of this power voltage can suppress an effect of power-voltage noises, thereby improving adjustment accuracy of the DLL circuit 10.

The data-output unit 14 of FIG. 8 includes the level-conversion unit 100, the output-buffer unit 110 or 120, the transfer-gate unit 130, and the latch-output unit 140. As shown in FIG. 8, the power voltage used by the data-output unit 14 is the external power voltage Vcc or Vccq, except that the internally reduced power voltage Vii is used by inverters provided in the output-buffer unit 110 or 120.

Use of the external power voltage Vcc or Vccq in the data-output unit 14 insures that the data output operation of the semiconductor device is not affected by power-voltage noises. As previously noted, the output-buffer unit 110 or 120 receives data signals that are based on the internally reduced power voltage Vii, and this is the reason why use of the internally reduced power voltage Vii is necessary.

Further, the number of logic stages inside the data-output unit 14 may be reduced to a minimum number. Such an arrangement helps to prevent operation from being affected by power fluctuation when the external power voltage Vcc or Vccq fluctuates unexpectedly. The smaller the number of logic stages, the smaller the number of logic elements using the external power voltage Vcc or Vccq is. As a result, an effect of fluctuation of the external power voltage Vcc or Vccq is reduced.

Since the data-output unit 14 uses the external power voltage Vcc or Vccq, transistors using this power voltage may be designed to have a longer gate length than would be used for the transistors using the internally reduced power voltage Vii. When transistors using the internally reduced power voltage Vii have a gate length of 0.38 $\mu$m in the case of PMOS transistors and a gate length of 0.32 $\mu$m in the case of NMOS transistors, for example, the transistors using the external power voltage Vcc or Vccq may be designed to have a gate length of 0.48 $\mu$m in the PMOS transistors and a gate length of 0.42 in the case of NMOS transistors.

As described above, the power voltage used by the output circuit 20, especially the power voltage used by the level converter 150 and the clock buffer 151, is set to the external power voltage Vcc or Vccq, thereby suppressing jitters caused by fluctuation of power voltages. Therefore, the present invention can provide semiconductor devices which can adjust timings of output data signals based on accurate control clock signals.

In the following, application of the present invention to input buffer circuits and input latch circuits will be described below. This will be described first with reference to FIG. 2.

In the configuration of FIG. 2, the input buffers 91 and 92 use the external power voltage Vcc as well as the internally reduced power voltage Vii. It should be noted that the input buffers 91 and 92 provide clock signals /CLK0 and CLK0, which need to be accurate in terms of their timings in order to properly control the timings of data output operation. In consideration of importance of maintaining accurate timings of clock signals, the input buffers 91 and 92 may be designed to operate solely based on the external power voltage Vcc.

In such an arrangement, the input buffers 91 and 92 use the external power voltage Vcc, which does not fluctuate in response to changes in power consumption by the semiconductor device, and the DLL circuit 10 uses the dedicated power voltage Viidll, which is supplied from a stable source of power voltage.

Accordingly, this configuration ensures accurate timings of the clock signals within the semiconductor devices and accurate timings of operation of the DLL circuit. The questions is, however, whether the external power voltage Vcc should be used by all the input buffers and input latch circuits provided in the semiconductor device.

If all the input buffer circuits and input latch circuits use the external power voltage Vcc, consumption of electric current tied to the external power voltage Vcc may exhibit a large fluctuation depending upon a combination of input address signals and input command signals. This results in fluctuation of the external power voltage Vcc despite the large capacitance associated with the external power voltage Vcc.

SDRAMs (synchronous dynamic random access memories) do not exhibit problems associated with input circuits when they operate at clock cycles only as fast as 10 ns, for example. At such an operation speed, input circuits generally provide sufficient operation margin. In order to keep up with an increase in speed that has been achieved in recent years, however, input circuits need a special design that ensures high timing accuracy.

Further, DDR-SDRAMs (double data rate SDRAMS) require input buffer circuits for receiving data signals to operate at a double clock rate while requires input buffer circuits for receiving address signals and command signals to operate only at a single clock rate. In such a configuration, input data buffers need to meet more rigorous standards than input buffers for receiving address/command signals.

Use of the external power voltage Vcc in the input buffers may ensure correct data acquisition timings of input data signals. Since a typical DDR-SDRAM has a pad arrangement in which a power pad, data pads, a power pad, clock pads, command pads, address pads, and a power pad are arranged in this order, noises created by an undesirable combination of an address and a command propagate through the VCC power lines to reach the input buffers for clock signals. This results in timings of the complement clock signals CLK and /CLK being less accurate.

In order to obviate this problem as well as to reduce power consumption, use of an internally reduced power voltage at appropriate locations may be a viable option in SDRAMs. Since the internally reduced power voltage is not stable and fluctuates depending on operation of internal circuits, however, use of the internally reduced power voltage must be made in a prudent manner, avoiding universal use thereof in every input buffer.

Accordingly, there is a need for a semiconductor device that can acquire input signals at timings as accurate as necessary while using an internally reduced power voltage for the purpose of reducing power consumption.

Figure 9:
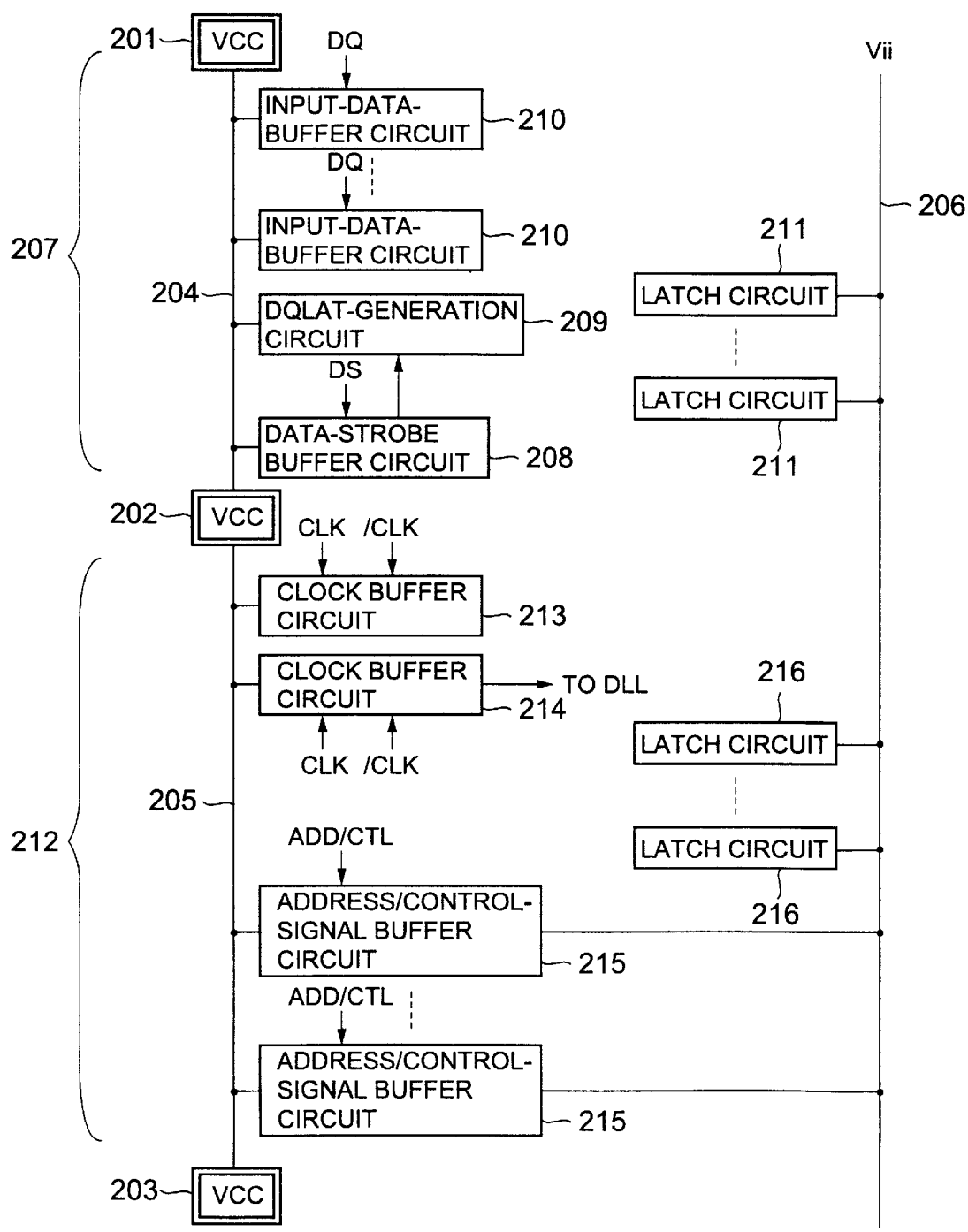
FIG. 9 is an illustrative drawing showing an input-circuit portion of a semiconductor device according to the present invention.

FIG. 9 is an illustrative drawing showing an input-circuit portion of a semiconductor device according to the present invention.

In FIG. 9, the input-circuit portion of the semiconductor device includes power-voltage pads 201 through 203, power-voltage lines 204 and 205, and a Vii-power-voltage line 206. The power-voltage pads 201 through 203 receive the external power voltage Vcc applied thereto. The power-voltage lines 204 and 205 convey the external power voltage Vcc. The Vii-power-voltage line 206 conveys the internally reduced power voltage Vii where the internally reduced power voltage Vii is generated by a Vii-generation circuit (not shown).

The input-circuit portion of the semiconductor device shown in FIG. 9 further includes a data-strobe buffer circuit 208, a DQLAT-generation circuit 209, a plurality of input-data-buffer circuits 210, a plurality of latch circuits 211, a clock buffer circuit 213, a clock buffer circuit 214, a plurality of address/control-signal buffer circuits 215, and a plurality of latch circuits 216. The data-strobe buffer circuit 208, the DQLAT-generation circuit 209, the input-data-buffer circuits 210, and the latch circuits 211 together form a data-input-circuit portion 207. The clock buffer circuit 213, the clock buffer circuit 214, the plurality of address/control-signal buffer circuits 215, and the plurality of latch circuits 216 together form an address/command-input-circuit portion 212.

The data-strobe buffer circuit 208 buffers a data-strobe signal DS supplied from an exterior of the device. The DQLAT-generation circuit 209 generates input-data latch signals DQLAT based on the data-strobe signal DS supplied from the data-strobe buffer circuit 208.

The input-data-buffer circuits 210 buffer input data signals DQ, and generates complement data signals DQ and /DQ. The latch circuits 211 receive the complement data signals DQ and /DQ supplied from the input-data-buffer circuits 210, and latch the input data DQ in synchronism with the input-data latch signals DQLAT.

The clock buffer circuit 213 buffers complement clock signals CLK and /CLK supplied from the exterior of the device, and generates an internal clock signal CLK1.

The clock buffer circuit 214 buffers the complement clock signals CLK and /CLK supplied from the exterior of the device, and generates an internal clock signal CLK2. Here, the internal clock signal CLK2 is supplied to a DLL circuit for controlling data-output timings of a data-output circuit. With regard to the control of data-output timings, FIG. 1 and FIG. 2 and descriptions provided in connection with these figures should be referred to.

The address/control-signal buffer circuits 215 buffer address signals or command signals supplied from the exterior of the device. The latch circuits 216 latch the address signals or the command signals supplied from the address/control-signal buffer circuits 215.

According to the present invention, the data-strobe buffer circuit 208, the DQLAT-generation circuit 209, the input-data-buffer circuits 210, the clock buffer circuit 214 receive the external power voltage Vcc and no other power voltage. The latch circuits 211 and the latch circuits 216 receive only the internally reduced power voltage Vii. The clock buffer circuit 213 and the address/control-signal buffer circuits 215 receive both the external power voltage Vcc and the internally reduced power voltage vii.

Underlining reasons behind this particular configuration are as follows. First, the data-input-circuit portion 207 needs highly accurate operation in terms of its operation timings because the data-input operation may be carried out at a double clock rate. The input buffer circuits of the data-input-circuit portion 207 thus should operate solely based on the external power voltage Vcc. The clock buffer circuit 214 supplies the clock signal CLK2 to the DLL circuit, which require accuracy in its operation timings, so that the clock buffer circuit 214 should also operate solely based on the external power voltage Vcc. The clock buffer circuit 213 and the address/control-signal buffer circuits 215 are not required to have as much timing accuracy, so these two circuits operate based on the external power voltage Vcc as well as internally reduced power voltage Vii.

Figure 10:
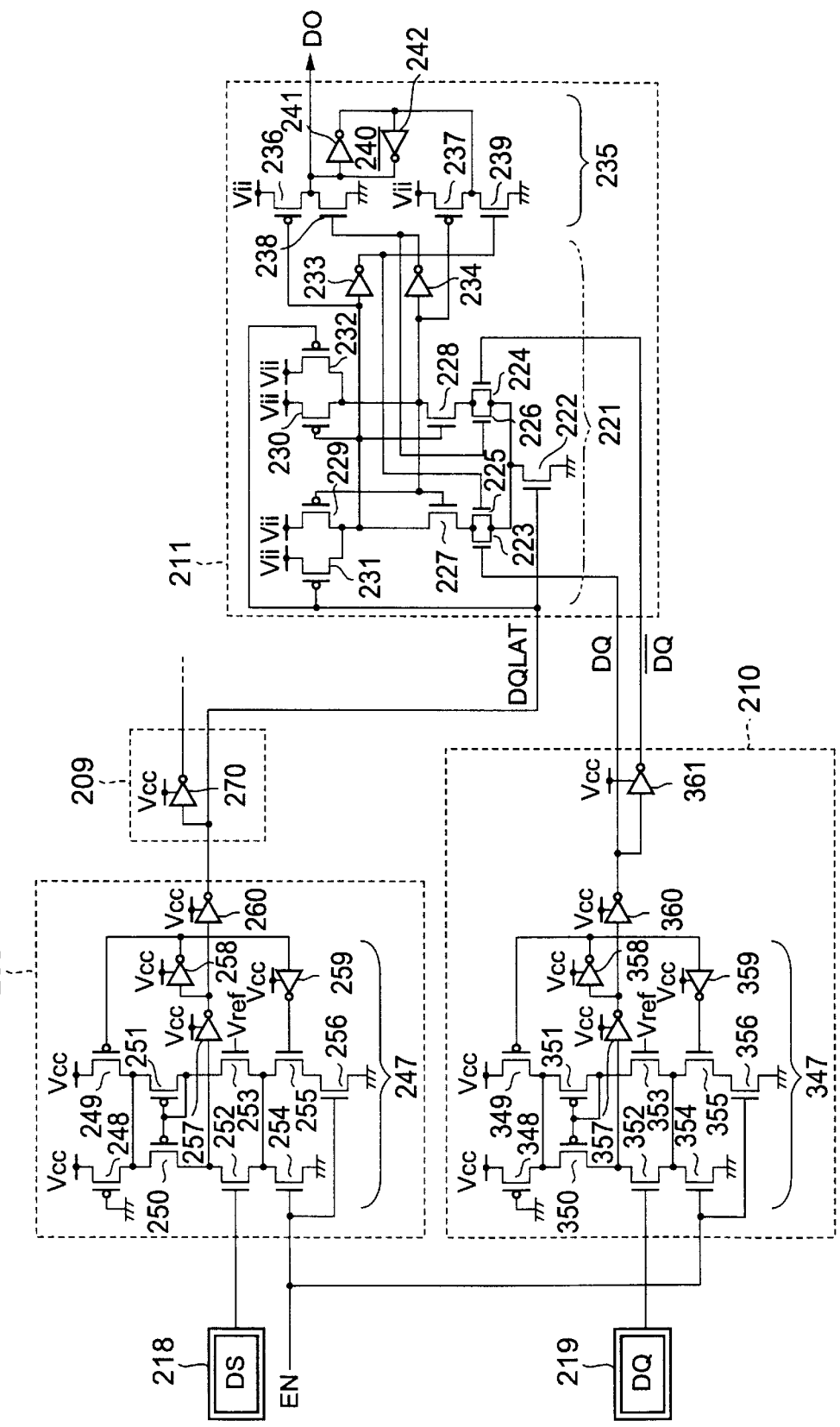
FIG. 10 is a circuit diagram showing part of a data-input-circuit portion.

FIG. 10 is a circuit diagram showing part of the data-input-circuit portion 207.

In FIG. 10, the data-strobe signal DS is supplied to a pad 218 from the exterior of the device, and the input data DQ is supplied to a pad 219 from the exterior of the device.

The latch circuit 211 includes NMOS transistors 222 through 228, PMOS transistors 229 through 232, and inverters 233 and 234, which together form a latch portion 221 of the latch circuit 211. The latch circuit 211 further includes an output-circuit portion 235, which includes PMOS transistors 236 and 237, NMOS transistors 238 and 239, and inverters 241 and 242. The inverters 241 and 242 make up a latch 240 that latches output data DO.

The data-strobe buffer circuit 208 includes PMOS transistors 248 through 251, NMOS transistors 252 through 256, and inverters 257 through 259, which together make up an amplifier unit 247. The amplifier unit 247 is a current-mirror amplifier circuit which receives the external power voltage Vcc as a power voltage, and uses a reference voltage Vref to detect the data-strobe signal DS based on a comparison between the reference voltage Vref and the data-strobe signal DS.

The data-strobe buffer circuit 208 further includes an inverter 260, which buffers the data-strobe signal DS output from the amplifier unit 247, and serves as a driver for the next stage. In the data-strobe buffer circuit 208, the inverter 260 receives the external power voltage Vcc as a power voltage in line with the other circuit elements.

The output of the data-strobe buffer circuit 208 is supplied to the DQLAT-generation circuit 209. The DQLAT-generation circuit 209 includes an inverter 270, which operates based on the external power voltage Vcc. Since the DDR-SDRAM uses both the rising edges and the falling edges of the data-strobe signal DS to latch the input data DQ, an inverse of the data-strobe signal DS needs to be generated inside the device. The DQLAT-generation circuit 209 is provided for this purpose.

The DQLAT-generation circuit 209 supplies the non-inverted data-strobe signal DS to the latch circuit 211 to indicate a timing at which the input data DQ is latched. The inverted data-strobe signal /DS, which is an output of the inverter 270, is supplied to another one of the latch circuits 211 that latches the input data DQ at different timings from the latch timings of the latch circuit 211 shown in FIG. 10.

The input-data-buffer circuit 210 includes PMOS transistors 348 through 351, NMOS transistors 352 through 356, and inverters 357 through 359, which together make up an amplifier unit 347. The amplifier unit 347 is a current-mirror amplifier circuit which receives the external power voltage Vcc as a power voltage, and uses a reference voltage Vref to detect the input data DQ based on the comparison between the reference voltage Vref and the input data DQ.

The input-data-buffer circuit 210 further includes an inverter 360, which buffers the input data DQ output from the amplifier unit 347, and serves as a driver for the next stage. In the input-data-buffer circuit 210, the inverter 360 receives the external power voltage Vcc as a power voltage in line with the other circuit elements.

The input-data-buffer circuit 210 further includes an inverter 361, which generates an inverse of the input data DQ. As a result, the input-data-buffer circuit 210 outputs complement data signals DQ and /DQ, which are supplied to the latch circuit 211.

FIG. 11 is a circuit diagram showing part of the address/command-input-circuit portion 212. The clock signal CLK is supplied to a pad 244, and the inverted clock signal /CLK is supplied to a pad 245. Further, a pad 246 receives an address signal ADD from an exterior of the device.

An enable signal EN is supplied to the clock buffer circuit 213, the clock buffer circuit 214, and the address/control-signal buffer circuits 215, and activates these circuits when it is high. When the enable signal EN is low, the buffer circuits 213 through 215 are deactivated.

The clock buffer circuit 214 includes PMOS transistors 448 through 451, NMOS transistors 452 through 456, and inverters 457 through 459, which together make up an amplifier unit 447. The amplifier unit 447 is a current-mirror amplifier circuit which receives the external power voltage Vcc as a power voltage, and generates a clock signal based on a comparison between the clock signal CLK and the inverted clock signal /CLK.

The clock buffer circuit 214 further includes an inverter 460, which buffers the clock signal that is output from the amplifier unit 447, and serves as a driver for the next stage. In the clock buffer circuit 214, the inverter 460 receives the external power voltage Vcc as a power voltage in line with the other circuit elements. The inverter 460 outputs the clock signal CLK2, which is supplied to a DLL circuit.

The clock buffer circuit 213 includes PMOS transistors 548 through 551, NMOS transistors 552 through 556, and inverters 557 through 559, which together make up an amplifier unit 547. The amplifier unit 547 is a current-mirror amplifier circuit which receives the external power voltage Vcc as a power voltage, and generates a clock signal based on a comparison between the clock signal CLK and the inverted clock signal /CLK.

The clock buffer circuit 213 further includes an inverter 560, which buffers the clock signal that is output from the amplifier unit 547, and serves as a driver for the next stage. In the clock buffer circuit 213, the inverter 560 receives the internally reduced power voltage Vii as a power voltage, which is different from the power voltage that is used by the other circuit elements. The inverter 560 outputs the clock signal CLK1, which is supplied to the latch circuits 216 shown in FIG. 11 to indicate a timing at which the address signal ADD is latched.

The address/control-signal buffer circuit 215 includes PMOS transistors 648 through 651, NMOS transistors 652 through 656, and inverters 657 through 659, which together make up an amplifier unit 647. The amplifier unit 647 is a current-mirror amplifier circuit which receives the external power voltage Vcc as a power voltage, and uses a reference voltage Vref to detect the address signal ADD based on the comparison between the address signal ADD and the reference voltage Vref.

The address/control-signal buffer circuit 215 further includes an inverter 660, which buffers the address signal that is output from the amplifier unit 647, and serves as a driver for the next stage. In the address/control-signal buffer circuits 215, the inverter 660 receives the internally reduced power voltage Vii as a power voltage, which is different from the power voltage used by the other circuit elements. The inverter 660 supplies the address signal ADD to the latch circuits 216, where the address signal ADD is latched at timings indicated by the clock signal CLK1.

The latch circuit 216 includes NMOS transistors 422 through 428, PMOS transistors 429 through 432, and inverters 433 and 434, which together form a latch portion 421 of the latch circuit 216. The latch circuit 216 further includes an output-circuit portion 435, which includes PMOS transistors 436 and 437, NMOS transistors 438 and 439, and inverters 441 and 442. The inverters 441 and 442 make up a latch 440 that latches the address data ADD.

In the manner as described above, the present invention uses the internally reduced power voltage Vii in some of the input buffers in order to reduce power consumption. However, the data-strobe buffer circuit 208, the DQLAT-generation circuit 209, the input-data-buffer circuits 210 use only the external power voltage Vcc, so that the input data DQ can be latched by the latch circuits 211 at highly accurate timings, satisfying a requirement for a relatively high accuracy when acquisition of the input data is concerned.

In the address/control-signal buffer circuits 215 for buffering address signals and command signals, the inverter that is provided following the amplifier unit receives the internally reduced power voltage Vii, and operates based on this reduced power voltage. The amplifier unit, however, receives the external power voltage Vcc that is more stable than the internally reduced power voltage Vii, thereby ensuring that the address signals and command signals are latched at timings no less accurate than are necessary.

Further, the clock buffer circuit 214 operates solely based on the external power voltage Vcc. Therefore, the clock buffer circuit 214 can provide the DLL circuit with a quite stable clock signal CLK2, thereby enabling the semiconductor device to output data at highly accurate timings.

The above embodiment has been described with reference to an example in which the present invention is applied to a DDR-SDRAM. It should be noted, however, that the present invention is not limited to this particular application, and is applicable to various semiconductor devices that operate based on input signals.

Further, the present invention is not limited to these embodiments, but various variations and modifications may be made without departing from the scope of the present invention.

The present application is based on Japanese priority applications No. 11-172611 filed on Jun. 18, 1999 and No. 11-171774 filed on Jun. 18, 1999 with the Japanese Patent Office, the entire contents of which are hereby incorporated by reference.

What is claimed is:

1. A semiconductor device receiving an external power voltage, comprising:
   a reduced-voltage-generation circuit which generates an internally reduced power voltage;
   an input circuit which operates based on the internally reduced power voltage;
   a clock-control circuit which generates an internal clock signal;
   an output circuit which outputs a data signal to an exterior of said device at output timings responsive to the internal clock signal;
   a clock-delivery circuit which conveys the internal clock signal from said clock-control circuit to said output circuit, and operates based on the external power voltage.

2. The semiconductor device as claimed in claim 1, wherein said clock-delivery circuit includes a level-conversion circuit which converts signal levels of the internal clock signal from a signal level based on the internally reduced power voltage into a signal level based on the external power voltage.

3. The semiconductor device as claimed in claim 1, wherein said clock-control circuit includes a DLL circuit.

4. The semiconductor device as claimed in claim 1, further comprising another reduced-voltage-generation circuit which generates a dedicated power voltage by lowering the external power voltage, wherein said DLL circuit operates based on the dedicated power voltage.

5. A semiconductor device, comprising:
   a reduced-voltage-generation circuit which generates an internally reduced power voltage by reducing an external power voltage supplied from an exterior of said device;
   an input circuit which operates based on the internally reduced power voltage;
   a clock-control circuit which generates an internal clock signal;
   an output circuit which outputs a data signal to the exterior of said device at output timings responsive to the internal clock signal;
   a clock buffer circuit which buffers a clock signal supplied from the exterior of said device to supply the clock signal to said clock-control circuit, and operates based on the external power voltage; and
   buffer circuits which buffer signals supplied from the exterior of said device, and operate based on the internally reduced power voltage.

6. The semiconductor device as claimed in claim 5, wherein each of said buffer circuits includes an amplifier portion and a driver portion, said driver portion operating based on the internally reduced power voltage while said amplifier portion operates based on the external power voltage.

7. A semiconductor device, comprising:
   a reduced-voltage-generation circuit which generates an internally reduced power voltage by reducing an external power voltage supplied from an exterior of said device;
   an input circuit which operates based on the internally reduced power voltage;
   first buffer circuits which buffer first signals supplied from the exterior of said device, and operate based on the external power voltage; and
   second buffer circuits which buffer second signals supplied from the exterior of said device, and operate based on the internally reduced power voltage.

8. The semiconductor device as claimed in claim 7, wherein each of said second buffer circuits includes an amplifier portion and a driver portion, said driver portion operating based on the internally reduced power voltage while said amplifier portion operates based on the external power voltage.

9. The semiconductor device as claimed in claim 7, further comprising:
   a strobe-buffer circuit which buffers a strobe signal supplied from the exterior of said device;
   first latch circuits which receive the respective first signals from said first buffer circuits, and latch the respective first signals at rising edges and falling edges of the strobe signal supplied from said strobe-buffer circuit.

10. The semiconductor device as claimed in claim 9, further comprising:
    a clock-buffer circuit which buffers a clock signal supplied from the exterior of said device;
    second latch circuits which receive the respective second signals from said second buffer circuits, and latch the respective second signals at rising edges of the clock signal supplied from said clock-buffer circuit.

* * * * *